United States Patent [19]

Chun et al.

[11] Patent Number: 5,521,992

[45] Date of Patent: May 28, 1996

[54] MOLDED OPTICAL INTERCONNECT

[75] Inventors: Christopher K. Y. Chun, Gilbert; Michael S. Lebby, Apache Junction, both of Ariz.

[73] Assignee: Motorola, Inc., Schaumburg, Ill.

[21] Appl. No.: 283,349

[22] Filed: Aug. 1, 1994

[51] Int. Cl.⁶ .................................................. G02B 6/12
[52] U.S. Cl. ............................ 385/14; 385/88; 385/129; 257/666; 257/678; 257/680; 257/734
[58] Field of Search ............................ 385/14, 88, 89, 385/129, 130, 131, 132; 257/666, 676, 678, 680, 690, 734

[56] References Cited

U.S. PATENT DOCUMENTS

| | | | |
|---|---|---|---|
| 4,732,446 | 3/1988 | Gipson et al. | 385/14 |
| 4,926,545 | 5/1990 | Pimpinella et al. | 29/832 |
| 5,101,460 | 3/1992 | Richard | 385/37 |
| 5,123,066 | 6/1992 | Acarlar | 385/14 |
| 5,125,054 | 6/1992 | Ackley et al. | 385/49 |
| 5,159,700 | 10/1992 | Reid et al. | 385/14 |
| 5,170,448 | 12/1992 | Ackley et al. | 385/31 |
| 5,200,631 | 4/1993 | Austin et al. | 257/81 |
| 5,208,879 | 5/1993 | Gallo et al. | 385/14 |
| 5,222,175 | 6/1993 | Tatoh | 385/93 |
| 5,249,245 | 9/1993 | Lebby et al. | 385/89 |
| 5,268,973 | 12/1993 | Jenevein | 385/74 |
| 5,271,083 | 12/1993 | Lebby et al. | 385/130 |
| 5,282,071 | 1/1994 | Hartman et al. | 359/129 |

*Primary Examiner*—Frank Gonzalez
*Attorney, Agent, or Firm*—Gary F. Witting

[57] ABSTRACT

A molded optical interconnect is provided. A plurality of electrical tracings is disposed thereon. An optical module having an optical surface and a photonic device are operably coupled to an interconnect substrate. A molded optical portion having a core region with a first end and a cladding region is positioned with the first end of the core region being adjacent to the optical surface of the integrated circuit to operably couple the first end of the core region to the optical surface of the integrated circuit.

25 Claims, 4 Drawing Sheets

MOLDED OPTICAL INTERCONNECT

BACKGROUND OF THE INVENTION

This invention, relates in general, to optoelectronic devices and, more particularly, to molded waveguides.

As the amount of information, as well as the speed of transferring information between electronic components increases, optoelectronic techniques or methods used for this transfer become more important. For example, in some high speed computers, optoelectronic techniques are used for clock distribution, thereby enabling standard electronic components to be timed correctly so as to manage the transfer of information more efficiently. However, at present, use of optoelectronic techniques has several major drawbacks or problems, such as being complex, inefficient, costly, and generally not suitable for high volume manufacturing. Thus, as the amount of information and the speed at which this information needs to be transferred, a need for a structure and a fabrication method that allows for efficient and cost effective manufacturing, as well as use of optoelectronic methods and optoelectronic devices will be required.

Conventionally, waveguides are manufactured by a combination of photolithographic and etching processes. For example, a conventional waveguide is fabricated by applying a suitable optical material onto an interconnect substrate, such as a printed board. A photoresist material is then applied onto the optical material and subsequently patterned by a photolithographic process. The pattern defined by the photolithographic process is subsequently transferred into the optical material by an etching process that removes exposed portions that are not covered by the photoresist material. The circuit board with the etched pattern is subsequently cleaned, which removes the residual photoresist material and leaves a resultant optical layer in place on the circuit board. As described above, conventional fabrication of optical layers used for waveguides using this sequence of events is not only complicated and expensive, but also does not lend themselves to high volume manufacturing.

It can be readily seen that conventional methods for manufacturing waveguides have severe limitations. Also, it is evident that conventional processes that are used to fabricate waveguides are not only complex and expensive but also not amenable to high volume manufacturing. Therefore, a method and a structure that lends itself for making waveguides and integrating these waveguides into a circuit board is highly desirable.

SUMMARY OF THE INVENTION

Briefly stated, a method and an article for making a molded optical interconnect is provided. An interconnect substrate having a major surface is provided. A plurality of electrical tracings is disposed on the major surface of the interconnect substrate with the plurality of electrical tracings having a contact apparatus to receive and to transmit electrical signals. An optoelectronic module having an optical surface and a photonic device that is operably mounted and coupled to the plurality of electrical tracings. A molded optical portion having a core region with a first end and a cladding region is positioned with the first end of the core region being adjacent and operably coupled to the optical surface of the optoelectronic module so as to operably couple the first end of the core region to the optical surface of the integrated circuit.

DETAILED DESCRIPTION OF THE DRAWINGS

Figure 1:
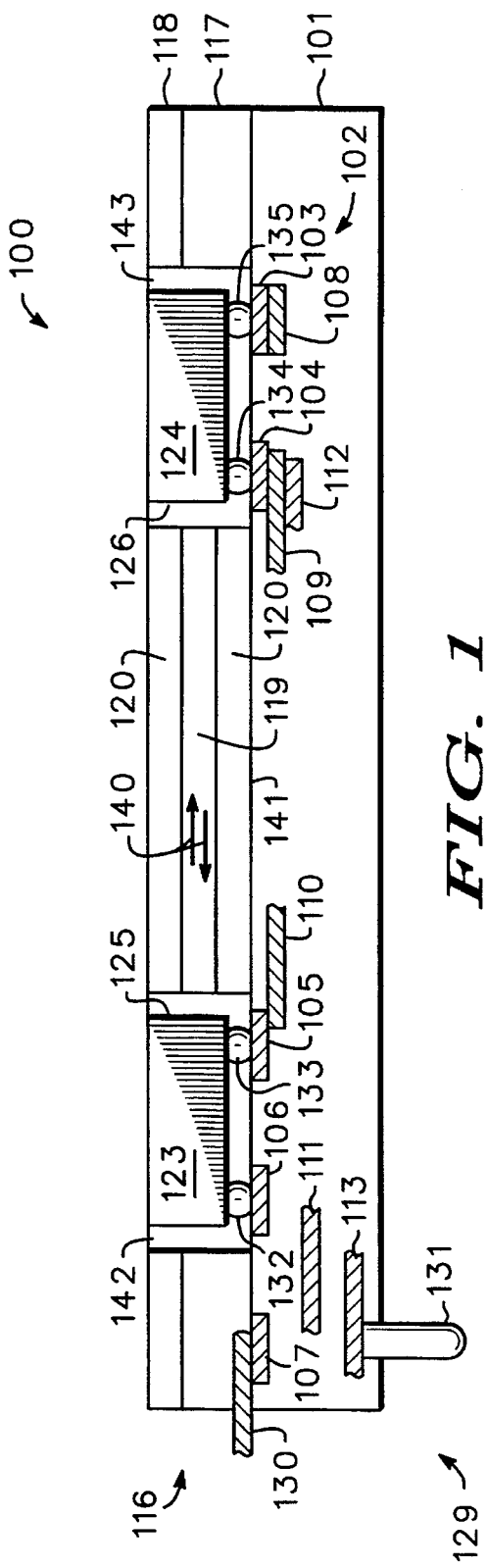
FIG. 1 is a greatly enlarged simplified sectional view of a molded optical interconnect.

FIG. 1 illustrates an enlarged simplified sectional view of an embodiment of a molded optical interconnect 100 having optoelectronic modules 123 and 124. It should be understood that molded optical interconnect 100 is a sectional view, thereby enabling molded optical interconnect 100 to continue into and out of FIG. 1. Further, molded optical interconnect 100 may also be expanded across FIG. 1, as well as incorporating other standard electronic components in the overall design of molded optical interconnect 100. Also, it should be understood that molded optical interconnect 100, as shown in FIG. 1, is only a simplified illustration, thus allowing a wide range of design modifications to be incorporated into molded optical interconnect 100.

Molded optical interconnect 100 is made of several components or elements, such as an interconnect substrate 101 with a surface 141, a plurality of electrical tracings 102, a molded optical portion 116 illustrated as having a first optical portion 117, a second optical portion 118, a core region 119, and a cladding region 120 that surrounds core region 119, optical modules 123 and 124 having optical surfaces 125 and 126, respectively, and connecting apparatus 129 illustrated as a leadframe member 130 and a pin 131 from a variety of pin connecting structures.

Generally, interconnect substrate 101 is made of any suitable interconnect substrate, such as a circuit board (PCB), a printed wireboard (PWB), a ceramic interconnect substrate, or the like. However, in a preferred embodiment of the present invention, interconnect substrate is a printed wireboard. As shown in FIG. 1, the plurality of electrical tracings 102 are disposed on and throughout interconnect substrate 101 by any suitable method. The plurality of electrical tracings 102 are further illustrated by electical tracings 103 through 112 shown in a variety of levels or layers in interconnect substrate 101. Electrical tracings 103, 104, 105, and 106 serve as bonding pads to electrically and mechanically couple optical modules 124 and 123, respectively, to the plurality of electrical tracings 102. Further, it should be understood that complexities illustrated in interconnect substrate 101 are not necessary for the practice the present invention. For example, interconnect substrate 101 can have a single level of the plurality of electrical tracings 102.

Electrical coupling of molded optical interconnect 100 to other electronic components is achieved by any suitable method. As shown by connecting apparatus 129, two such methods are illustrated, i.e., electrical tracing 107 is electrically coupled to leadframe member 130 and electrical tracing 113 is electrically coupled to pin 131, thereby enabling electrical signals to be inputted and outputted through connecting apparatus 129, as well as operably coupling optical modules 123 and 124.

Optical modules 123 and 124 can be any suitable optoelectronic device, such as an integrated circuit having photonic capabilities, optoelectronic interface, or the like.

Generally, optoelectronic modules 123 and 124 communicate or pass signals by both electrically coupling and optically coupling optoelectronic modules 123 and 124 with interconnect substrate 101. Electrical communication is achieved by any suitable method, such as sockets and pins, bump bonding, formed leadframe members, and the like. As shown in FIG. 1, electrical communication from optoelectronic modules 123 and 124 to interconnect substrate 101 ifs accomplished by bumps 132, 133, 134, and 135 that are conductive, thereby electrically and mechanically coupling optoelectronic modules 123 and 124 to electrical traces 106, 105, 104, and 103, respectively, of the plurality of electrical traces 102. Electrical coupling of optoelectronic modules 123 and 124 to the plurality of electrical traces 102 of interconnect substrate 101 enables electrical signals to be inputted through connecting apparatus 129 from outside electronic components and systems, such as other electronic boards, other integrated circuits, and the like to affect optoelectronic modules 123 and 124. Alternatively, electrical coupling of optoelectronic modules 123 and 124 to interconnect substrate 102 enables optical signals that enter optoelectronic modules 123 and 124 that are subsequently converted to electrical signals to be sent to the plurality of electrical traces 102 of interconnect substrate 101 through conductive bumps 132, 133, 134, and 135 and subsequently into electrical traces 106, 105, 104, and 103 which are further routed and outputted through connecting apparatus 129 to effect outside electronic components, such as other electronic boards, other IC's, other electronic systems, and the like.

As illustrated in FIG. 1, optoelectronic modules 123 and 124 each have optical surfaces 125 and 126, respectively, that enable light signals, illustrated by arrows 140, to enter and leave optical modules 123 and 124, thereby optically linking optical modules 123 and 124 to core region 119 of molded optical portion 116.

Further, as shown in FIG. 1, optoelectronic modules 123 and 124 are optically linked by core region 119, thus enabling optical communication between optoelectronic modules 123 and 124. Also it will be understood that while FIG. 1 illustrates optical linking of optoelectronic modules 123 and 124, many more optoelectronic modules can be located throughout molded optical interconnect 100 that are optically linked, as well as other standard electronic components. It will be further understood that IC's can be mounted throughout molded optical interconnect 101 and electrically coupled to the plurality of electrical traces 102 of interconnect substrate 101, thereby incorporating optical communication and electrical coupling with standard electronic components.

By optically linking optical modules 123 and 124, as well as other optoelectronic modules, information is communicated between optical modules 123 and 124 at a much faster speed than if the information was routed electrically through the plurality of electrical traces 102, thereby enhancing speed of communication between optical modules 123 and 124, enhancing speed of communication between other electronic components and optoelectronic components, and reducing electromagnetic interference (EMI).

Molded optical portion 116 is made by any suitable molding or overmolding process. Generally, molded optical portion 116 is made including first optical portion 117 and second optical portion 118. Fabrication of optical portion 116 is achieved by placing interconnect substrate 101 into a molding system (not shown). A molding system delineates a channel, illustrated in FIG. 1 as finished core region 119, and openings 142 and 143 having exposed bonding pads or electrical traces 103, 104, 105, and 106 of the plurality of electrical traces 102, thereby allowing optical modules 123 and 124 to be electrically and mechanically mounted to interconnect substrate 101 in openings 142 and 143. Further, molded optical portion 116 is made so that the channel is aligned or positioned for eventual optical coupling between optical surfaces 125 and 126 of optoelectronic modules 123 and 124 and finished core region 119, thereby providing optical communication between optical modules 123 and 124.

Typically, a molding compound or molding material is injected into the molding system and on surface 141 of interconnect substrate 101, thereby forming first optical portion 117 with the groove and openings 142 and 143.

The molding compound injected into the mold is made of optically transparent materials, such as polymers, epoxies, plastics, polyimides, or the like that are selected to be transparent at a desired wavelength of light. Generally, refractive indexes of these optically transparent materials range from 1.4 to 1.7. However, in a preferred embodiment of the present invention, the refractive indexes of the optically transparent materials range from 1.54 to 1.58.

Processing conditions for these molding materials or molding compounds range from 22.0 to 200.0 degrees Celcuis for molding temperatures and 200.0 to 2,200 pounds per square inch for molding pressures. A subsequent curing process such as ultraviolet light treatment, temperature treatments, or the like is done which permanently transfers intricacies or negative images of the mold into first optical portion 117.

Once the curing processes are complete, the molding system and first molded optical portion 117 attached to interconnect substrate 101 is exposed and subsequently removed from the molding system.

Generally, second optical portion 118 is made in a similar manner and simultaneously with first optical portion 117, thereby enabling rapid and automated manufacturing of molded optical portion 116 with cladding region 120 surrounding core region 119. Optical portion 117 with attached interconnect substrate 101 is further processed by applying an optical media such as an epoxy, a polyimide, a plastic, or the like to the grooves formed in first optical portion 117. Subsequently, first optical portion 117 and second optical portion 118 are adhered or joined together to form optical portion 116 having core region 119 surrounded by cladding region 120.

Typically, the optical media fills the grooves to form core region 119 and adheres second optical portion 118 to first optical portion 117. Application of second optical portion 120 to first optical portion 117 completes cladding region 120 which surrounds core region 119. However, it should be understood that light signals 140 traveling through core region 119 are capable of traveling to their destinations without second optical portion 120 being applied to first optical portion 117. However, it should be further understood by not completing or surrounding cladding region around core region 119 optical signals are not as effectively transferred and guided through core region 119.

Figure 2:
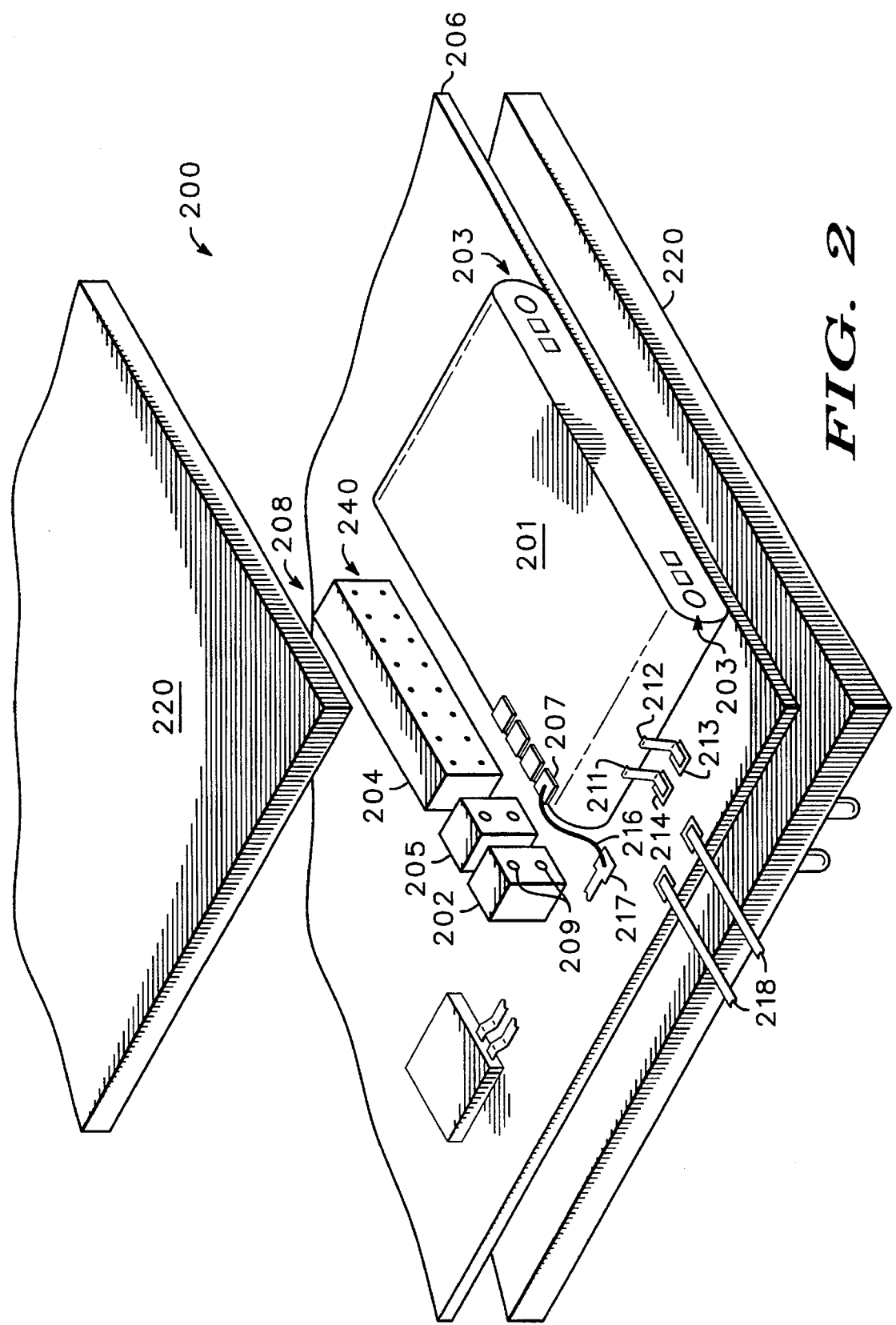
FIG. 2 illustrates an enlarged simplified partially exploded view of an optoelectronic module.

FIG. 2 illustrates a simplified partial exploded pictorial view of a portion of optoelectronic module 200. A molded optical waveguide 201 is electrically coupled to standard electronic components on interconnect board 206 by any suitable method, such as wire bonding, tab bonding, bump bonding, or the like. However, while any suitable method for coupling molded optical waveguide 201 to interconnect substrate 206 are appropriate, wire bonding and leadframe bonding are specifically illustrated in FIG. 2, as being the most preferred in the present invention. By way of example, a wire bond 216 operably couples tab 207 to bonding pad 217 and lead frame members 211, 212 are operably coupled to bonding pads 213, 214, respectively. Further, it should be understood that optoelectronic module 200 is one example of many methods of making optical electronic module 200 that are capable of being used in the present invention.

Molded optical waveguide 201 having a plurality of core regions 203 is fitted with photonic components 208 such as a phototransmitter or laser 202, a photodetector or photodiode 205, or a combination of both lasers and detectors. Alternatively, array 204 is mounted on waveguide 202 which can include a variety of different photonic components.

Photonic components 208 are mounted to molded optical waveguide 201 in a manner that individual working portions, indicated by arrow 240, of photonic components 208 are aligned to individual core regions of the plurality of core regions 203 of waveguide 201, thus providing maximum light transmission through the individual core regions of the plurality of core regions 203 of waveguide 201.

For example, laser 202 is mounted to tab 207 and a tab (not shown) by an electrical and mechanical connection 209. Typically, electrical and mechanical connection 209 is achieved by any suitable method, such as conductive bumps, e.g., solder bumps, gold bumps, conductive epoxy bumps, or the like. By accurately mounting laser 202 to molded optical waveguide 201 and making electrical and mechanical connections 209, light transmission from a working portion of laser 209 is guided through one of the core regions of the plurality of core regions 203 of molded optical waveguide 201.

Molded optical waveguide 201 including photonic components 208 is attached to interconnect board 206 by any suitable method such as adhering, press fitting, molding, or the like. However, in a preferred embodiment of the present invention, an epoxied adhesive is applied to interconnect board 206 in an approximate location where molded optical waveguide 201 and interconnect board 206 are to be bonded or joined. Waveguide 201 is then placed onto the adhesive by an automated system such as a robotic arm, thereby providing accurate placement and orientation of waveguide 201.

Electrical coupling of standard electronic components on interconnect board 206 through optical components 208 is illustrated by wire bond 216 from bonding pad 217 to tab 207, as well as by leadframe members 211 and 212 being mounted and electrically coupled to bonding pads 213 and 214, respectively. It should be evident by one skilled in the art that many more electrical couplings typically are necessary to fully utilize inputs and outputs of both the standard electronic components and the optical components. It should be further evident that standard output and input means, represented by leads 218, bumps 209, and the like are capable of being used to optically and electrically couple photonic components 208 and waveguide 201 together.

Further, plastic encapsulation of interconnect substrate 206 and molded optical waveguide 201 typically is achieved by an overmolding process, represented by plastic pieces 220 which encapsulates interconnect substrate 206 and optical waveguide 201, whereby access to core regions of waveguide 201 are easily utilized, as well as being able to convert electrical signals into optical signals.

Figure 3:
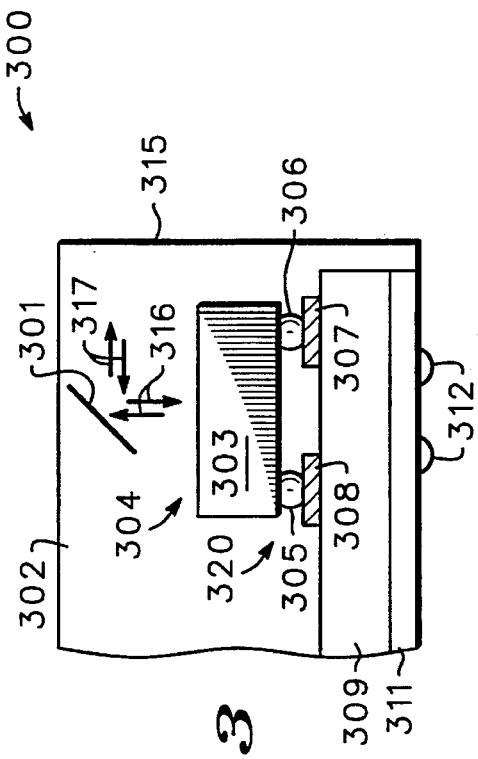
FIG. 3 illustrates a highly enlarged simplified sectional view of an optoelectronic integrated circuit.

FIG. 3 is a highly enlarged, simplified sectional view of an optoelectronic integrated circuit 300. Optoelectronic integrated circuit 300 illustrates a portion of optoelectronic integrated circuit 300 that includes a reflective surface 301, a molded optical portion 302, a photonic device 303 having a working portion 304, a coupling apparatus 320 having conductive bumps 305, 306, bonding pads 308, 307, respectively, integrated circuit substrate 309, light signals, represented by arrows 316 and 317, flag 311, and connecting apparatus 312. It should be understood that only a small portion of optoelectronic integrated circuit 300 is shown so as to more clearly illustrate the present invention.

Photonic device 303 is mounted to integrated circuit substrate 309 by any suitable method, such as bump bonding, wire bonding, or the like. However, as shown in FIG. 3, photonic device 303 is mounted to integrated circuit substrate 309 through conductive bumps 305, 306 and bonding pads 308, 307, thereby electrically and mechanically coupling photonic device 303 to integrated circuit substrate 309. Once photonic device 303 is mounted to integrated circuit substrate 309, integrated circuit substrate 309 is placed in molding system and overmolded. Additionally, during overmolding of integrated circuit substrate 309, reflective surface 301 is positioned in the molding system so that reflective surface 301 is incorporated into optoelectronic integrated circuit 300. Additionally, reflective surface 301 is made of any suitable material, such as a plastic, e.g., a plastic having a different refractive index, a metal, e.g., leadframe member, or the like.

Generally, molding materials used for molded optical portion 302 are similar, if not the same, as discussed hereinabove with reference to FIG. 1. Briefly, any suitable material is used for making molded optical portion 302, such as plastics, epoxies, polyimides, or the like having a suitable refractive index 1.3 to 1.7 with a preferred range of refractive index being between 1.4 and 1.5. However, since optoelectronic integrated circuit 300 is to be placed in molded optical interconnect 100 having core region 119 with a specific refractive index, molding material selection is made so that the refractive index of molded optical portion 302 matches or is similar to the refractive index of core region 119 of molded optical interconnect 100. Thus, transmission of light signals 304 and 317 are enhanced so as to facilitate transmission of light signals 304 and 317 into and out of molded optical portion 302.

In function, optical signals of light signals, indicated by arrows 316 and 317, travel through molded optical portion 302 so as to communicate information to and from optoelectronic integrated circuit 300. As illustrated in FIG. 3, light signals 316 emanating from working portion 304 of photonic device 303 are reflected off of reflective surface 301 and toward optical surface 315. If, for instance, optoelectronic integrated circuit 300 is mounted in molded optical interconnect 100 shown hereinabove, optical signals 317 reflected from reflective surface 301 and through molded optical portion 302 would pass through optical surface 315 and into core region 119. Alternatively, light striking optical surface 315 and entering molded optical portion 302, as shown by arrows 317, strikes and is reflected off of reflective surface 301. Light signals 317 reflected off of reflective surface 301, indicated by arrows 304, are directed towards photonic device 303.

Figure 4:
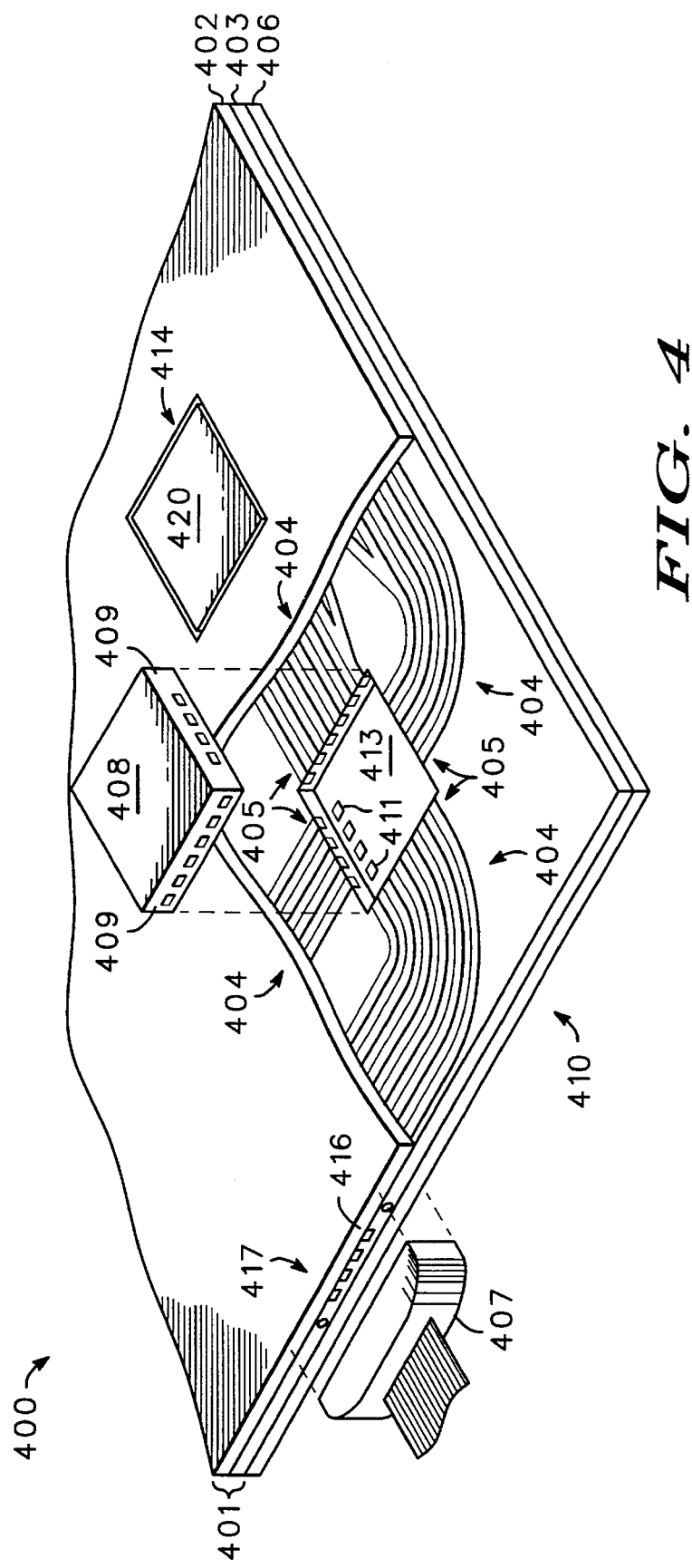
FIG. 4 is an enlarged simplified perspective view of an embodiment of the molded optical interconnect.

FIG. 4 shows a greatly enlarged partial view of multichip module (MCM) 400, with a portion 410 thereof removed, illustrating several main elements or features of MCM 400, such as molded optical portions 401 having a first molded optical portion 402 and a second molded optical portion 403, a plurality of core regions 404 having a plurality of optical surfaces or ends 405, an interconnect substrate 406, an optical connector 407, an optical module 408 having a plurality of optical surfaces 409, a plurality of bonding pads 411, openings 413 and 414, and integrated circuit 420.

Interconnect substrate 406 is similar to interconnect substrate 101 of FIG. 1 discussed hereinabove, thus not requiring further discussion at present. As shown in FIG. 4 with portion 410 removed from MCM 400 and with optical module 408 elevated, internal workings of MCM 400 are more clearly viewable. The plurality of core regions 404 are exposed and can be seen to travel throughout first optical portion 403.

Opening 413 of molded optical portion 401 exposes a plurality of bonding pads 411 on interconnect substrate 406 as well as a plurality of optical surfaces 405 of the plurality of core regions 404 that terminate at opening 413. Mounting of optical module 408 to interconnect substrate 406 is achieved by any suitable method described herein and above. However, for illustrative purposes only, bonding pads 411 are electrically coupled to optical module 408 by a conductive bump method, thereby electrically and mechanically coupling optical module 408 and interconnect substrate 406, as well as positioning optical surfaces 414 of optical module 408 to optical surfaces or ends 405 of the plurality of core regions 404. Once optical module 408 is mounted into opening 413 and operably coupled to bonding pads 411, the plurality of optical surfaces 409 of optical module 408 are aligned and operably coupled to the plurality of optical surfaces 405 of the plurality of core regions 404, thereby both electrically and optically coupling optical module 408 to interconnect substrate 406, thus integrating standard electronic components with optical components.

Further, optical connector 407 illustrates optical coupling from another source, such as another board, another optoelectronic system, or the like to MCM 400, thereby enabling light signals, i.e., information, to be inputted and outputted of MCM 400 opticallly. More specifically, optical fibers (not shown) in optical connector 407 are aligned to optical surfaces 416 of core regions 417, there by operably coupling MCM 400 with optical connector 407.

Integrated circuit 420 illustrates an incorporation or integration of standard electronic components into MCM 400, thereby uniting standard electronic components with optical components so that greater speed or movement of information is achieved.

Figure 5:
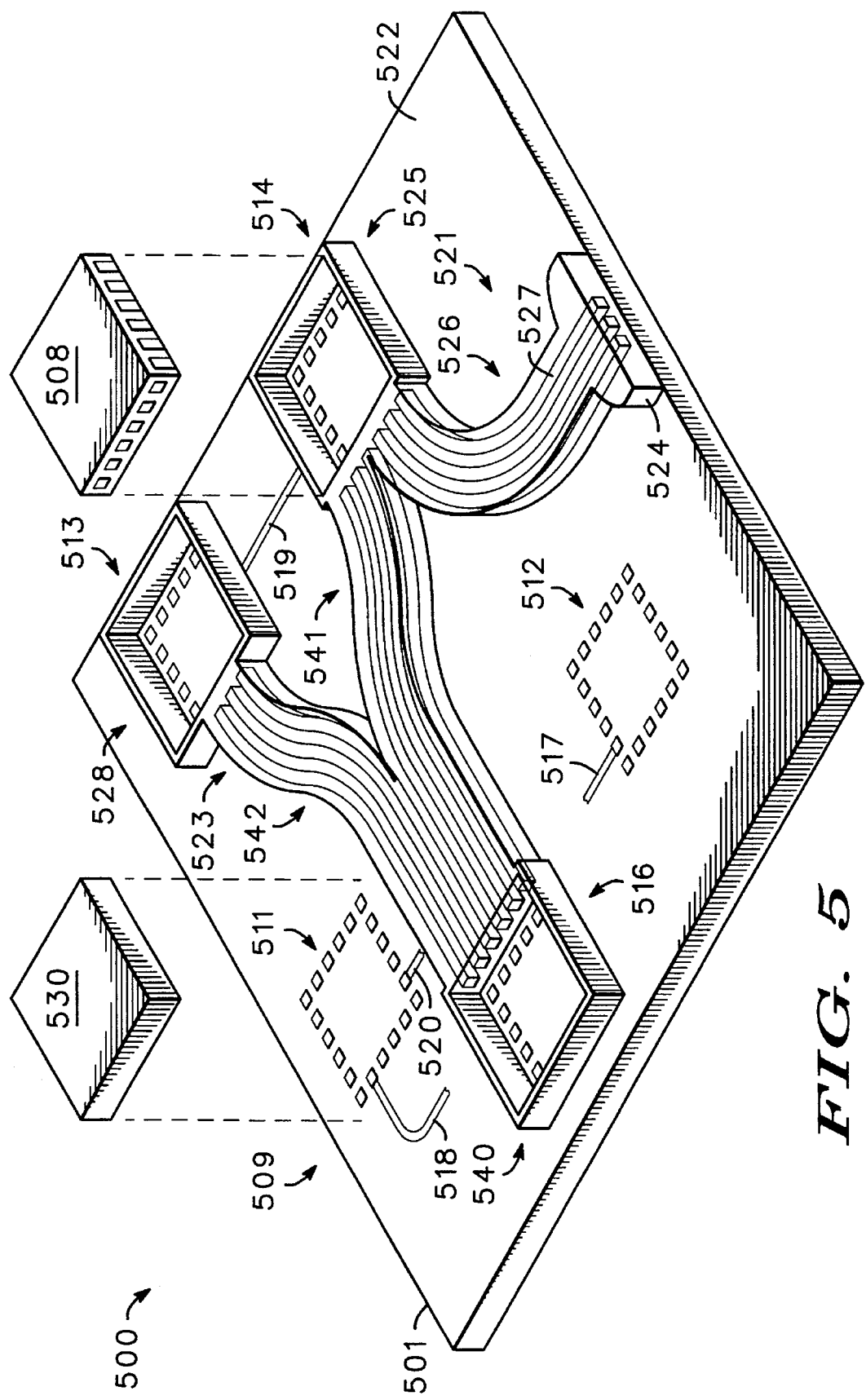
FIG. 5 is an enlarged simplified perspective view of another embodiment of the molded optical interconnect.

FIG. 5 is a greatly enlarged simplified perspective view of an embodiment of the present invention. As can be seen in FIG. 5, multichip module (MCM) 500 is made having several main components or features, such as interconnect substrate 501 with a surface 522 having a plurality of electrical tracings 509 illustrated by bonding pads 511, 512, 513, 514, 516, and electrical traces 517, 518, 519, and 520, an optical module 508, a molded optical portion 521 with optical portions 541, 542, having a plurality of core regions 527, optical connection site 524, an integrated circuit 530, and optoelectronic sockets 525, 528, and 540.

Generally, interconnect substrate 501 is similar to previously described interconnect substrates 101, 206, 309, and 406, thus not necessitating an in-depth description of interconnect substrate 501. However, since interconnect substrate 501, as shown in FIG. 5, is viewed as a perspective illustration, several features or elements are illustrated more clearly than in previous illustrations. As shown in FIG. 5, the plurality of electrical tracings 509 are disposed on surface 522 of interconnect substrate 501. More specifically, electrical tracings 517 through 520 illustrate electrical tracings that conduct electrical signals throughout interconnect substrate 522. These electrical tracings 517 through 520 also conduct electrical signals to appropriate bonding pads so as to conduct electrical signals to appropriate integrated circuits and optical modules, illustrated by integrated circuit 530 and optical module 508, thereby integrating standard electronic components and optical modules on interconnect substrate 501.

Molded optical portion 521 is disposed on surface 522 of interconnect substrate 501 as described hereinabove; however, in this particular embodiment of the present invention, molded optical portion 521 is disposed on surface 522 so as to guide a plurality of core regions 123 to their appropriate destinations without entirely overmolding on surface 522, thereby leaving portions of surface 522 of interconnect substrate 501 open or clear of molding compounds used for making molded optical portion 521.

As can be seen in FIG. 5, molded optical portion 521 is made having an optical connection port 524 which is optically coupled to optoelectronic socket 525 through molded optical portion 526 having core region 527. Optoelectronic socket 525 is operably coupled to optoelectronic socket 540 which is also operably coupled to optoelectronic socket 528 through molded optical portions 541 and 542, respectively. Further, it should be understood that optoelectronic sockets 525, 540, and 528 include bonding pads 514, 516, and 513, thus enabling optoelectronic modules to be mounted into optoelectronic sockets, thereby enabling integration of both optoelectronics and standard electronic components, such as integrated circuit 530 together in a multichip format.

By now, it should be appreciated that a novel optoelectronic multichip device and method of making has been described. The optoelectronic multichip interconnect incorporates optoelectronics and standard electronic components using molded optical waveguides to operably couple standard electronic components with optical device, thereby taking advantage of speed of optoelectronics while still maintaining or incorporating standard electronic components. Further, use of molded optical waveguides and molded optical modules enable cost effective manufacturing of multichip modules. Additionally, the methods of making both molded waveguides for interconnect substrates incorporates standard electronic components with optical modules in a highly manufacturable process.

We claim:

1. A molded optical interconnect comprising:

an interconnect substrate having a major surface;

a plurality of electrical tracings with a first electrical contact disposed on the major surface of the interconnect substrate;

a molded optical portion having a core region with a first end, a cladding region, and an opening disposed on the interconnect substrate with the opening exposing the first electrical contact of the plurality of electrical tracings and the first end of the core region, the core region and the cladding region having a first refractive index and a second refractive index, respectively; and an integrated circuit having an optical surface, a photonic device, and a second electrical contact with the second electrical contact of the integrated circuit operably coupled to the first electrical contact of the plurality of electrical tracings and the optical surface operably coupled to the first end of the core region of the molded optical portion.

2. A molded optical interconnect as claimed in claim 1 further including:

a third electrical contact of the plurality of electrical tracings disposed on the interconnect substrate;

a second end of the core region of the molded optical portion disposed on the interconnect substrate; and another integrated circuit with a second optical surface, a second photonic device, and a fourth electrical contact, the fourth electrical contact of the another integrated circuit operably coupled to the third electrical contact of the plurality of electrical tracings and the second optical surface of the another integrated circuit operably coupled to the second end of the core region of the molded optical portion.

3. A molded optical interconnect as claimed in claim 1 wherein the first electrical contact and the second electrical contact are operably coupled by an electrical socket and an electrical pin.

4. A molded optical interconnect as claimed in claim 1 wherein the first electrical contact and the second electrical contact are operably coupled by an electrically conductive bump.

5. A molded optical interconnect as claimed in claim 1 wherein the first refractive index and the second refractive index of the core region and cladding region range from 1.4 to 1.7.

6. A molded optical interconnect as claimed in claim 1 wherein the first refractive index of the core region is 0.01 higher than the second refractive index of the cladding region.

7. A molded optical interconnect as claimed in claim 1 further including a space with a distance between the first end of the core region and the optical surface of the integrated circuit, the distance between the first end of the core region and the optical surface of the integrated circuit ranging to 200.0 millimeters.

8. A molded optical interconnect as claimed in claim 1 wherein the first photonic device is a laser.

9. A molded optical interconnect as claimed in claim 8 wherein the laser is a vertical cavity surface emitting laser.

10. A molded optical interconnect as claimed in claim 1 wherein the first photonic device is a photodetector.

11. A molded optical interconnect as claimed in claim 10 wherein the photodetector is photodiode.

12. A molded optical interconnect as claimed in claim 1 further including a second molded optical portion positioned on the molded optical portion.

13. A molded optical interconnect comprising:

an interconnect substrate having a major surface;

a plurality of electrical tracings having a first electrical contact disposed on the major surface of the interconnect substrate;

a molded optical portion having a core region with a first end having a first optical surface, a cladding region, and an opening disposed on the interconnect substrate, the opening exposing the first electrical contact and the first optical surface of the first end of the core region, the core region and the cladding region having a first refractive index and a second refractive index, respectively; and an integrated circuit having an second optical surface, a photonic device, a second electrical contact, the second optical surface of the integrated circuit being parallel to the first optical surface of the core region for optical coupling of the core region to the integrated circuit, the second electrical contact of the integrated circuit operably coupled to the first electrical contact of the plurality of electrical tracings and the first optical surface of the second optical surface of the integrated circuit.

14. A molded optical interconnect as claimed in claim 13 further including:

another integrated circuit with an optical surface, the another integrated circuit operably mounted to a second connecting apparatus to the plurality of electrical tracings; and a second end of the cladding region, the second end of the core region being operably coupled to the optical surface of the another integrated circuit and the second end of the core region.

15. A molded optical interconnect as claimed in claim 13 wherein the connecting apparatus is a pin and a socket.

16. A molded optical interconnect as claimed in claim 13 wherein the connecting apparatus is an electrically conductive bump.

17. A molded optical interconnect as claimed in claim 16 wherein the electrically conductive bump is a solder bump.

18. A molded optical interconnect as claimed in claim 13 wherein the first optical portion has a refractive index ranging from 1.4 to 1.7.

19. A molded optical interconnect as claimed in claim 13 wherein the optical surface and the core region are separated by a distance ranging from 2.0 millimeters to 200.0 millimeters.

20. A molded optical interconnect as claimed in claim 13 wherein the photonic device is a laser.

21. A molded optical interconnect as claimed in claim 13 wherein the laser is a vertical cavity light emitting device.

22. A molded optical interconnect as claimed in claim 21 wherein the photonic device is a light emitting diode.

23. A molded optical interconnect as claimed in claim 13 wherein the photonic device is a photoreceiver.

24. A molded optical interconnect as claimed in claim 23 wherein the photoreceiver is a photodiode.

25. A method for making a optical interconnect for an multichip module comprising the steps of:

providing an interconnect substrate having a major surface with a plurality of electrical tracings disposed thereon, one of the plurality of electrical tracing having a contact;

molding an optical portion having a core region with a first end, a cladding region, and an opening, the opening of the optical portion positioned to expose the contact of the plurality of tracings;

providing an integrated circuit having an optical surface with a photonic device and an electrical output; and coupling the optical surface of the integrated circuit to the first end of the core region and coupling the electrical output of the integrated circuit to the contact of the plurality of electrical tracings.

\* \* \* \* \*